(12) United States Patent
Shida et al.

(10) Patent No.: US 9,214,181 B2
(45) Date of Patent: Dec. 15, 2015

(54) RECORDING FILM FOR OPTICAL INFORMATION RECORDING MEDIUM, OPTICAL INFORMATION RECORDING MEDIUM, AND SPUTTERING TARGET USED TO FORM SAID RECORDING FILM

(75) Inventors: Yoko Shida, Kobe (JP); Yuki Tauchi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 267 days.

(21) Appl. No.: 14/115,547

(22) PCT Filed: May 30, 2012

(86) PCT No.: PCT/JP2012/063917
§ 371 (c)(1),
(2), (4) Date: Nov. 4, 2013

(87) PCT Pub. No.: WO2012/165472
PCT Pub. Date: Dec. 6, 2012

(65) Prior Publication Data
US 2014/0093672 A1    Apr. 3, 2014

(30) Foreign Application Priority Data

May 31, 2011 (JP) ................................. 2011-122910

(51) Int. Cl.
*G11B 7/24*     (2013.01)
*G11B 7/243*    (2013.01)
*C23C 14/00*    (2006.01)
*C23C 14/08*    (2006.01)
*C23C 14/34*    (2006.01)

(52) U.S. Cl.
CPC ............ *G11B 7/243* (2013.01); *C23C 14/0036* (2013.01); *C23C 14/086* (2013.01); *C23C 14/3407* (2013.01); *C23C 14/087* (2013.01); *G11B 2007/2432* (2013.01); *G11B 2007/24306* (2013.01); *G11B 2007/24308* (2013.01)

(58) Field of Classification Search
CPC ..................... Y10T 428/21; Y10T 428/31678
See application file for complete search history.

(56) References Cited

U.S. PATENT DOCUMENTS

| 6,229,785 B1 | 5/2001 | Kitaura et al. |
| 2005/0082162 A1 | 4/2005 | Uno et al. |
| 2005/0237894 A1 | 10/2005 | Mishima et al. |
| 2005/0244753 A1 | 11/2005 | Mishima et al. |
| 2009/0029091 A1 | 1/2009 | Deguchi et al. |

FOREIGN PATENT DOCUMENTS

| JP | 2002 225433 | 8/2002 |
| JP | 2003 326848 | 11/2003 |
| JP | 2004 284018 | 10/2004 |
| JP | 3638152 | 1/2005 |
| JP | 2005 135568 | 5/2005 |
| JP | 3802040 | 5/2006 |
| JP | 2006 256309 | 9/2006 |
| TW | 200805355 A | 1/2008 |

OTHER PUBLICATIONS

Written Opinion Issued Sep. 4, 2012 in PCT/JP12/063917 Filed May 30, 2012.
International Search Report Issued Sep. 4, 2012 in PCT/JP12/063917 Filed May 30, 2012.

*Primary Examiner* — Gerard Higgins
(74) *Attorney, Agent, or Firm* — Oblon, McClelland, Maier & Neustadt, L.L.P.

(57) ABSTRACT

Provided is a recording film for an optical information recording medium with which it is possible to meet all predetermined characteristics requirements and increase productivity while reducing the number of layers in the optical information recording medium. The present invention relates to a recording film for an optical information recording medium on which recording is performed by laser light irradiation, wherein the recording film for an optical information recording medium includes: Mn; at least one element (group X element) selected from the group consisting of Bi, Ag, Co, Cu, In, Sn, and Zn (group X); and oxygen (O). At least some of the Mn and at least some of the group X element are oxidized.

5 Claims, 1 Drawing Sheet

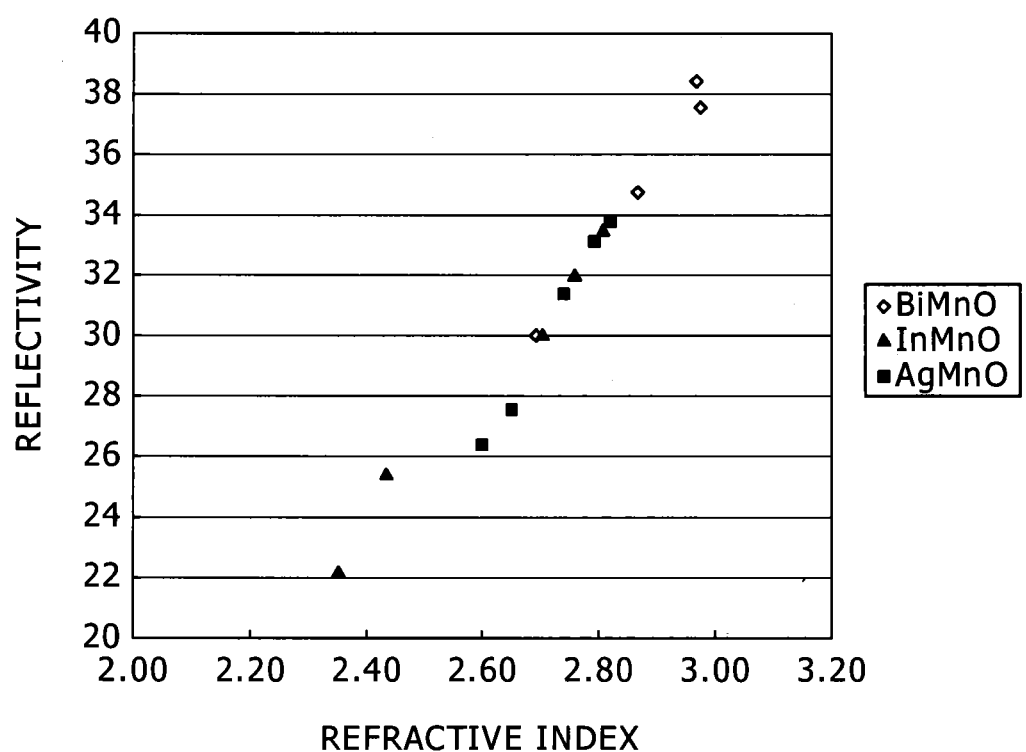

RECORDING FILM FOR OPTICAL INFORMATION RECORDING MEDIUM, OPTICAL INFORMATION RECORDING MEDIUM, AND SPUTTERING TARGET USED TO FORM SAID RECORDING FILM

TECHNICAL FIELD

The present invention relates to a recording film for an optical information recording medium, an optical information recording medium, and a sputtering target useful for forming the recording film.

BACKGROUND ART

Optical information recording media (optical discs) can be roughly classified, in accordance with the recording and reproducing manner thereof, into a ROM (read only memory) type, which is a type used only for reading, an R (recordable) type, which is a write-once type, and an RW (rewritable) type, which is a rewritable type. Among discs of these types, discs of the write-once type have a recording layer changeable by irradiation with a laser ray, and can be roughly classified mainly into the following in accordance with the recording manner thereof: a pitting type of making record marks, such as bores or pits, locally into the recording film; a phase-change type of changing the phase of the recording film; an interlayer reaction type of causing plural recording films to react with each other; and a type of decomposing a compound constituting the recording film.

As a recording film of the pitting type out of the above-mentioned types, disclosed is a recording film containing a low-melting-point metal such as Sn or Bi (for example, Patent Literature 1). This film makes use of a matter that pits are made in the recording layer by heating through a laser ray, so that the optical path length of a ray reflected thereon is changed, thereby making a change between the marks and the space region. As a recording film of the phase-change type, for example, a Te—O—Pd recording layer is disclosed (for example, Patent Literatures 2 and 3). By radiating a laser ray thereto, the recording film is changed in crystal structure to be changed in optical constant accordingly. Thus, record is made therein. As a recording film of the interlayer reaction type, disclosed is, for example, a recording film which is changed by a reaction between its two recording layers in contact with each other, for example, between In—O—(Ni, Mn, Mo) of its first recording layer and Se—Te—O—(Ti, Pd, Zr) of its second recording layer, so as to be changed in optical constant (for example, Patent Literature 4). As a recording film of the type of decomposing a compound constituting the recording film, a recording film is disclosed in which, for example, an oxide or nitride low in decomposition temperature is used (for example, Patent Literature 5). Record is made therein by heating the oxide or the like to be decomposed.

CITATION LIST

Patent Literatures

PTL 1: JP 2002-225433 A
PTL 2: Japanese Patent No. 3638152
PTL 3: JP 2005-135568 A
PTL 4: JP 2003-326848 A
PTL 5: Japanese Patent No. 3802040

SUMMARY OF INVENTION

Technical Problem

In connection with property required for any optical information recording medium, it is important whether or not the medium is recordable by a laser ray radiated thereto. Specific examples of the property include a characteristic that the medium is recordable by a practical recording power (that the medium has a high recording sensitivity); one that a signal recorded therein has a signal amplification sufficient for reproduction (that the medium has a high modulation degree); and one that the recorded signal is high in precision (that the medium shows a low jitter value). Furthermore, it is important that the medium has a reflectivity sufficient for reproduction.

However, about any recording material disclosed in the prior art, it is difficult that the recording material alone (mono-layered film) satisfies these required characteristics. Thus, it is essential to make the material into a laminated structure. About, for example, the phase-change type, a recording film thereof alone is low in reflectivity; thus, it is necessary that the film has a reflective film in order to be made high in reflectivity when in a state of an optical disc. Additionally, in order to increase the modulation degree thereof, it is necessary to lay dielectric layers made of, for example, $ZnS—SiO_2$, over and under the recording film, respectively. Thus, the number of layers constituting the optical disc is increased. About the interlayer reaction type, plural recording films are required; thus, the number of layers constituting the optical disc is increased to cause a problem of lowering the disc in productivity. By contrast, about the pitting type, a recording film thereof is, itself, high in reflectivity and can further ensure a large modulation degree. Thus, the number of layers constituting the optical disc can be decreased. However, in order to attain a higher recording sensitivity, it is necessary to improve the film further.

The present invention has been made in light of such a situation, and an object thereof is to provide a recording film for an optical information recording medium which can decrease the number of layers of the optical information recording medium and which simultaneously satisfies the above-mentioned required characteristics (characteristics that the film is recordable at a low recording power, and the film has a high modulation degree, a low jitter value, and a high reflectivity sufficient for reproduction) so as to be made high in productivity; an optical information recording medium having this recording film; and a sputtering target useful for forming the recording film.

Solution to Problem

The invention provides the following recording film for an optical information recording medium, optical information recording medium, and sputtering target:

(1) A recording film for an optical information recording medium, which is recordable by irradiation with a laser ray; and
which comprises Mn; one or more elements (group-X element(s)) selected from the group consisting of Bi, Ag, Co, Cu, In, Sn and Zn (group X); and oxygen (O);
wherein at least one partial quantity of Mn, and at least one partial quantity of the group-X element(s) are oxidized.
(2) The recording film for an optical information recording medium according to item (1), wherein the group-X element(s) is/are Bi, and the atomic proportion (%) of Mn into the total of Mn and Bi is more than 20%, and 60% or less.

(3) The recording film for an optical information recording medium according to item (1), wherein the group-X element(s) is/are In, and the atomic proportion (%) of Mn into the total of Mn and In is more than 20%, and 80% or less.

(4) The recording film for an optical information recording medium according to item (1), wherein the group-X element(s) is/are Cu, and the atomic proportion (%) of Mn into the total of Mn and Cu is more than 10%, and 80% or less.

(5) The recording film for an optical information recording medium according to item (1), wherein the group-X element(s) is/are Bi and Cu, the atomic proportion (%) of Bi into the total of Mn, Bi and Cu is 10% or more, and 50% or less, and further the atomic proportion (%) of Mn into the total of Mn, Bi and Cu is 20% or more, and 40% or less.

(6) The recording film for an optical information recording medium according to item (1), wherein the group-X element(s) is/are Bi and In, the atomic proportion (%) of Bi into the total of Mn, Bi and In is 20% or more, and less than 40%, and further the atomic proportion (%) of In into the total of Mn, Bi and In is more than 20%, and 40% or less.

(7) The recording film for an optical information recording medium according to item (1), wherein the group-X element(s) is/are Ag and In, the atomic proportion (%) of Mn into the total of Mn, Ag and In is 30% or more, and 50% or less, and further the atomic proportion (%) of In into the total of Mn, Ag and In is 30% or more, and 50% or less.

(8) The recording film for an optical information recording medium according to item (1), wherein the group-X element(s) is/are Bi, Cu and Co, the atomic proportion (%) of Mn into the total of Mn, Bi, Cu and Co is 20% or more, and 40% or less, the atomic proportion (%) of Cu into the total of Mn, Bi, Cu and Co is 10% or more, and 35% or less, and further the atomic proportion (%) of Bi into the total of Mn, Bi, Cu and Co is 10% or more, and 30% or less.

(9) An optical information recording medium, comprising the recording film recited in any one of items (1) to (8).

(10) An optical information recording medium, comprising the recording film recited in any one of items (1) to (8), and comprising, over and/or under the recording film, one or more dielectric layers.

(11) The optical information recording medium according to item (10), wherein the recording film has a film thickness of 10 to 100 nm, and the dielectric film(s) (each) has/have a thickness of 2 to 30 nm.

A sputtering target for forming the recording film, for an optical information recording medium, recited in any one of items (1) to (8), comprising Mn; one or more elements (group-X element(s)) selected from the group consisting of Bi, Ag, Co, Cu, In, Sn and Zn (group X); and an inevitable impurity as the balance of the target.

Advantageous Effects of Invention

The present invention makes it possible to provide a recording film for an optical information recording medium (particularly, a recording film for a recordable-type optical information recording medium) that can attain a high modulation degree and a low jitter value even when this medium receives a practical recording laser power, which is a relatively low power, and that further has a sufficiently high reflectivity when made into the optical information recording medium; and an optical information recording medium (particularly, a recordable-type optical information recording medium) having this recording film.

The invention also makes it possible to provide a sputtering target useful for forming the above-mentioned recording film.

BRIEF DESCRIPTION OF DRAWINGS

FIG. 1 is a graph showing a refractive-index/reflectivity (reflectivity of a mono-layered recording film) relationship of each of samples Nos. 1 to 14 in Table 1.

DESCRIPTION OF EMBODIMENTS

The inventors have repeated investigations to provide a recording film, for an optical information recording medium, that has above-mentioned characteristics. As a result, the inventors have found out that: Mn is an element very useful for increasing the refractive index of a recording film itself in order to improve the characteristics, it is indispensable to use one or more elements (group-X element(s)) selected from the group consisting of Bi, Ag, Co, Cu, In, Sn and Zn (group X); and when oxygen (O) is added thereto and then at least one partial quantity of Mn contained in the resultant recording film and at least one partial quantity of the group-X element(s) contained therein are oxidized to form an inorganic oxide, the inorganic oxide is decomposed by heat of a laser ray radiated into the oxide, whereby a predetermined mark is formed so that record can be attained. Thus, the invention is accomplished.

The wording "at least one partial quantity of Mn and at least one partial quantity of the group-X element(s) are oxidized" herein means that about all the metal elements constituting the invention, at least one of each of the metal elements is oxidized. When the recording film contains, for example, two or more elements as the group-X element(s), the wording means that at least one partial quantity of each of the two or more elements is oxidized.

The wording "at least one partial quantity" has a meaning which also includes an embodiment in which Mn and the group-X element(s) (denoting, when the element(s) are two or more group-X elements as described above, all of these group-X elements) are oxidized into a degree below the degree of the oxidization for causing these elements to satisfy the stoichiometric composition thereof, so that the elements are not necessarily oxidized into the state of satisfying the stoichiometric composition. However, in order to cause the recording film to exhibit effectively the recording performance of the inorganic oxide on the basis of the decomposition thereof, these elements are preferably oxidized to satisfy the stoichiometric composition. More preferably, it is recommendable that the resultant oxide is present in the state of a peroxide, which has a composition over the stoichiometric composition, whereby the oxide can be made far lower in decomposition temperature to be improved in recording performance.

Accordingly, the recording film of the invention for an optical information recording medium is a recording film, for an optical information recording medium, that is recordable by irradiation with a laser ray; and that comprises Mn; one or more elements (group-X element(s)) selected from the group consisting of Bi, Ag, Co, Cu, In, Sn and Zn (group X); and oxygen (O); wherein at least one partial quantity of Mn, and at least one partial quantity of the group-X element(s) are oxidized. The recording film can be represented by Mn-"group-X element(s)"-O. The group-X element(s) is/are one or more elements selected from the group X, and may be two or more elements. The content by percentage of each of Mn and the group-X element(s) contained in the recording film is variable in accordance with the composition constituting the recording film, and is appropriately selectable into a preferred range in such a manner that the recording film can exhibit desired characteristics.

In the present specification, the atomic proportion (%) of any metal element into all metal elements (not including oxygen) constituting the recording film may be referred to merely as the metal proportion. When the recording film contains Mn and Bi to be represented by Mn—Bi—O, the atomic proportion (%) of Mn into all the metal elements (Mn+Bi) may be referred to as the Mn proportion.

In the invention, any recording product may be represented as one excellent in recording sensitivity (recording property) when the product satisfies all of the following: record can be made therein by a low recording power (detailedly, when the recording power is measured by a method described in Examples that will be described later, the recording power is 9.0 mW or less); the product has a high modulation degree (detailedly, when the modulation degree is measured by a method described in Examples, which will be described later, the modulation degree is 0.4 or more); and the product has a low jitter value (detailedly, when the jitter value is measured by a method described in Examples, which will be described later, the jitter is 6.5% or less).

In the invention, any recording product may be represented by as one excellent in reflective property when the product has a high reflectivity sufficient for reproduction (detailedly, when the reflectivity is measured by a method described in Examples, which will be described later, the reflectivity is 4% or more). The optical information recording medium of the invention is a recording product satisfying all of these requirements.

Hereinafter, a detailed description will be made.
(About Mn)

The recording film of the invention for an optical information recording medium is a film in which Mn is contained and at least partial quantity of Mn is oxidized. This manner makes it possible to give an optical information recording medium excellent in recording sensitivity and also excellent in reflective property.

In the invention, Mn is an element selected as an element useful for increasing the refractive index of the recording film itself (mono-layered recording film) to ensure a high reflectivity according to basic experiments made by the inventors. Hereinafter, a description will be made about the basis experiments, which result in the selection of Mn, with reference to Table 1.

Table 1 shows results obtained by using an ellipsometry, M-2000U, manufactured by J. A. Woollam Co., Inc. to measure the refractive index (synonymous with the optical constant) of each of samples (mono-layered recording films) obtained by forming recording films (thickness: 20 nm) having various compositions shown in Table 1 onto glass substrates (thickness: 0.7 mm), respectively. About the samples, Table 1 also shows results obtained by using a spectrophotometer to measure the respective reflectivities of their mono-layered recording films. For reference, FIG. 1 shows a chart obtained by plotting a refractive-index/reflectivity relationship of each of samples Nos. 1-4 (Bi—Mn—O). FIG. 1 shows, in turn from the left side thereof, results of the sample wherein Mn proportion=20% (No. 1), that wherein Mn proportion=40% (No. 2), that wherein Mn proportion=60% (No. 3) and that wherein Mn proportion=80% (No. 4). About samples Nos. 5-9 (In—Mn—O) and Nos. 10-14 (Ag—Mn—O), FIG. 1 also shows a chart obtained by plotting respective refractive-index/reflectivity relationships thereof.

TABLE 1

| No. | Composition | Mn proportion (%) | Refractive index | Reflectivity (%) of mono-layered film |
|---|---|---|---|---|
| 1 | BiMnO | 20 | 2.70 | 30.01 |
| 2 | BiMnO | 40 | 2.86 | 34.77 |
| 3 | BiMnO | 60 | 2.96 | 38.45 |
| 4 | BiMnO | 80 | 2.97 | 37.60 |
| 5 | InMnO | 10 | 2.35 | 22.20 |
| 6 | InMnO | 20 | 2.43 | 25.48 |
| 7 | InMnO | 40 | 2.70 | 30.05 |
| 8 | InMnO | 60 | 2.76 | 32.00 |
| 9 | InMnO | 80 | 2.80 | 33.52 |
| 10 | Ag | 0 | 2.60 | 26.43 |
| 11 | AgMnO | 10 | 2.65 | 27.55 |
| 12 | AgMnO | 30 | 2.74 | 31.38 |
| 13 | AgMnO | 40 | 2.79 | 33.10 |
| 14 | AgMnO | 50 | 2.82 | 33.68 |

From Table 1 and FIG. 1, it is understood that about samples Nos. 1-4 of Bi—Mn—O, with an increase in the quantity of Mn, the refractive index is increased and the reflectivity of their mono-layered recording film is proportionately thereto increased. The same tendency is observed also about samples Nos. 5-9 of In—Mn—O, which contain In instead of Bi, and samples Nos. 11-14 of Ag—Mn—O, which contain Ag instead of Bi. By contrast, about sample No. 10, which contains no Mn, the refractive index is low and the reflectivity is also low.

From Table 1, it is readable out that: in cases of using, as the group-X element(s), Bi (Nos. 1-4), In (Nos. 5-9), and Ag (Nos. 11-14), respectively, the reflectivities thereof (the respective reflectivities of their recording films themselves) are different from each other; and a preferred metal proportion of Mn for ensuring substantially the same reflectivities (the respective reflectivities of the mono-layers: for example, 30% or more) is also varied in accordance with the species of the group-X element(s). Specifically, in order to attain such reflectivities, it is effective to adjust a preferred Mn proportion to about 20% or more in cases where the group-X element(s)=Bi, to about 40% or more in cases where the group-X element(s)=In, and to about 30% or more in cases where the group-X element(s)=Ag.

The reflectivities shown in Table 1 are respective reflectivities of the recording films themselves, but are not respective reflectivities of optical information recording media. Thus, it is impossible to decide, from the results, a preferred proportion of Mn or the like in a recording film. However, it is assumed from the results in Table 1 that: the reflectivity of a recording film is varied in accordance with the species of the group-X element(s) therein; and in order that the film can ensure a predetermined reflectivity, a preferred proportion or preferred respective proportions of the group-X element(s) (proportion or respective proportions of the group-X element(s) to all the metal elements) are varied.

(About the Group-X Element(s))

The recording film of the invention for an optical information recording medium is a film in which: one or more elements (group-X element(s)) are contained which are selected from the group consisting of Bi, Ag, Co, Cu, In, Sn and Zn (group X); and at least partial quantity of the group-X element(s) is oxidized. This manner makes it possible to give an optical information recording medium excellent in recording sensitivity and also excellent in reflective property.

In other words, results of investigations made by the inventors have demonstrated that only Mn does not give a sufficient recording sensitivity but the use of Mn together with one or more of the elements in the group X makes it possible to attain desired characteristics. The elements in the group X may be used alone or in combination of two or more thereof.

A detailed reason why the recording sensitivity and the reflective property are improved by the use of Mn together with the group-X element(s) is unclear; however, it appears that about, for example, Bi and Ag among the elements in the group X, the oxide of these elements is low in decomposition temperature, so that the oxide is easily decomposed by irradiation with a laser ray, thereby improving the recording film in recording property. Co and Cu are added to the recording film to supply absorptivity to the recording film. By the supply of absorptivity to the recording film, the recording film can effectively absorb a laser ray so that a laser power necessary for recording can be shifted into a lower power range. In, Sn and Zn make it possible to control the transmittance to form a colorless and transparent oxide. As a result, a necessary transmittance can be given to a recording film for a BD-R that has a mono-layered structure. Furthermore, in the formation of a BD-R having a multi-layered structure in which a dielectric layer, a light transmissible layer, and other layers are laminated onto each other, a necessary transmittance can be given to the whole of the BD-R. Additionally, an optical information recording medium excellent also in recording property can be obtained. In order to cause the medium to exhibit these effects based on the addition of the group-X element(s), it is preferred to control the (respective) content(s) by percentage of the group-X element(s) appropriately in accordance with the composition of the recording film. This manner gives an optical information recording medium excellent in both of recording sensitivity and reflective property.

The recording film of the invention for an optical information recording medium further contains oxygen (O) as an essential element besides the above-mentioned metal elements (Mn and the group-X element(s)). This element, oxygen, is a component effective for making marks when record is made. It is necessary that the recording film contains O in an amount necessary for a matter that at least partial quantity of Mn and at least partial quantity of the group-X element(s) are present in an oxide form. When the recording film contains two or more (for example, a $1^{st}$ group-X element and a $2^{nd}$ group-X element) of the elements in the group X, it is necessary that at least partial quantity of each of all the group-X elements contained in the recording film is present in an oxide form (for example, the $1^{st}$ and $2^{nd}$ group-X elements are present in an oxide state of the $1^{st}$ group-X element and the same state of the $2^{nd}$ group-X element). A preferred proportion of oxygen (O) contained in the recording film is varied in accordance with the species of the group-X element(s), the ratio between the metals in the recording film, and others. In general, it is preferred to control, into the range of 50 to 60%, the atomic proportion (%) of oxygen into all the components (all the metal elements+O) constituting the recording film. The proportion of oxygen (O) contained in the recording film is controllable by adjusting appropriately the flow rate of oxygen, and other factors, out of sputtering conditions when the film is formed. On the basis of the flow rate of oxygen, and the other factors, the proportion of oxygen can be decided.

When the recording film is, for example, Mn—Bi—O, which contains Mn and Bi, the proportion (atomic proportion) of "Bi+O" to all the elements "Mn+Ni+O" constituting the recording film is preferably less than 80%. In this case, the recording film is improved in reflective property. Patent Literature 5 described above also discloses an oxide recording film (Mn—Bi—O) containing Mn and Bi; however, in a preferred range of "Bi+O" relative to all the elements "Mn+Ni+O" constituting the recording film, this film is different from the recording film of the invention. Specifically, Patent Literature 5 states that by controlling the range of the proportion into 80% or more, an optical information recording medium can be realized in which data are certainly recorded and reproduced. However, results of investigations made by the inventors have demonstrated that recording media in which the range is controlled into 80% or more as stated in Patent Literature 5 are lowered in reflective property since the proportion of Mn to all the metal elements (the Mn proportion) becomes small.

Table 2 shows: results obtained by imitating compositions of a recording film described in Patent Literature 5 to use Mn—Bi—O films (Nos. 1-5) in which the Mn proportion and Bi proportion into all metal elements were variously changed, and measuring the reflectivity of each of the films; and the respective contents by percentage of elements contained in the recording film in the same way as described in Patent Literature 5.

Detailedly, mono-layered recording films having a thickness of 200 to 400 nm were formed, respectively, on Si substrates (thickness: 0.5 mm), and then a full automatic fluorescent X-ray spectrometer "RIX-3000" manufactured by Rigaku Corp. was used to measure the respective contents by percentage of elements in each of the recording films. In order to heighten the precision of the contents by percentage of the elements, a Rh bulb was used as a bulb to form a mono-layered Cu film, a mono-layered Bi film, and a mono-layered Mn film (thickness of each of the films: 200 nm), respectively, onto Si substrates. For each of the elements, a standard curve was then prepared to measure the sensitivity correction factor of the element. About O, $Bi_2O_3$ powder was used to measure the sensitivity correction factor. On the basis of the thus measured sensitivity correction factors, amendments were made to decide the Cu content by percentage (atomic %), the Bi content by percentage (atomic %) and the Mn content by percentage (atomic %). Furthermore, in accordance with the following equation, the O content by percentage (atomic %) was decided:

"Content by percentage of O (atomic %)"="content by percentage of all the elements (atomic %)"−["content by percentage of Cu (atomic %)"+"content by percentage of Bi (atomic %)"+"Mn (atomic %)"]

In the same ways as in Examples, which will be described later, the samples were measured about the recording power, the jitter value and the modulation degree thereof.

For reference, Table 2 shows results obtained by measuring oxide recording films further containing Cu (Mn—Bi—Cu—O) in the same way as described above.

TABLE 2

| No. | Mn | Bi | Cu | O | (Bi + O) | Mn proportion (%) | Bi proportion (%) | Cu proportion (%) | Recording power (mW) | Jitter value (%) | Modulation degree | Reflectivity (%) | Evaluation |
|---|---|---|---|---|---|---|---|---|---|---|---|---|---|
| 1 | 4.9 | 31.6 | 0 | 63.5 | 95.1 | 13 | 87 | 0 | 4.2 | 5.95 | 0.76 | 7.0 | X |
| 2 | 20.7 | 26.6 | 0 | 52.7 | 79.3 | 44 | 56 | 0 | 4.3 | 5.96 | 0.69 | 10.4 | ◯ |
| 3 | 21.2 | 18.1 | 0 | 60.7 | 78.8 | 54 | 46 | 0 | 4.4 | 5.55 | 0.66 | 11.6 | ◯ |

TABLE 2-continued

| No. | Mn | Bi | Cu | O | (Bi + O) | Mn proportion (%) | Bi proportion (%) | Cu proportion (%) | Recording power (mW) | Jitter value (%) | Modulation degree | Reflectivity (%) | Evaluation |
|---|---|---|---|---|---|---|---|---|---|---|---|---|---|
| 4 | 10.9 | 14.6 | 11.0 | 63.5 | 78.1 | 30 | 40 | 30 | 4.2 | 5.77 | 0.70 | 10.2 | ○ |
| 5 | 7.6 | 21.2 | 11.6 | 59.6 | 80.8 | 19 | 52 | 29 | 4.1 | 5.52 | 0.75 | 9.4 | X |

From Table 2, it is understood about sample No. 1 in Table 2, wherein as disclosed in Patent Literature 5 described above, the occupation proportion of "Bi+O" into all components (Mn+Bi+O) constituting the recording film is as high as 80% or more so that the Mn proportion is as small as 13% (a preferred Mn proportion into a Mn—Bi recording film is more than 20% and 60% or less, as will be detailed later), that this sample is good in recording power, jitter value and modulation degree, but is lowered in reflectivity.

By contrast, samples Nos. 2 and 3, in each of which a preferred occupation proportion of "Bi+O" into all components (Mn+Bi+O) is less than 80% so that the Mn proportion is controlled into the preferred range in the invention, is excellent in recording sensitivity and is further high in light reflectivity.

The same tendency has been recognized when recording films further containing Cu (Mn—Bi—Cu—O) have been used. Specifically, according to Table 2, about sample No. 5 in Table 2, wherein as disclosed in Patent Literature 5, the occupation proportion of "Bi+O" into all components (Mn+Bi+Cu+O) constituting the recording film is as high as 80% or more so that the Mn proportion is as small as 19% not to satisfy any preferred Mn proportion into the invention, this sample is good in recording power, jitter value and modulation degree, but is lowered in reflectivity. By contrast, sample No. 4, wherein the occupation proportion of "Bi+O" into all components (Mn+Bi+Cu+O) constituting the recording film is less than 80% so that the Mn proportion is controlled into the preferred range in the invention, is quite excellent in recording sensitivity and light reflectivity.

Specific examples of the structure of the recording film according to the invention for an optical information recording medium include binary recording films, wherein metal elements, which do not include oxygen (O), are two elements, such as Mn—Bi—O, Mn—In—O, Mn—Cu—O and Mn—Ag—O ternary recording films, wherein metal elements, which do not include oxygen (O), are three elements, such as Mn—Bi—Cu—O, Mn—Bi—In—O, and Mn—Ag—In—O; and quaternary recording films, wherein metal elements, which do not include oxygen (O), are four elements, such as Mn—Bi—Cu—Co—O.

In order to cause the recording film of the invention to exhibit desired characteristics more effectively, it is preferred to use, as the film, a recording film containing, in particular, at least Bi or Ag, out of the elements in the group X. An example of this embodiment is an embodiment wherein a recording film contains Bi or Ag alone, or contains these elements. It does not matter whether the embodiment is of a binary, ternary or quaternary species, or of any other species.

As has been shown by use of Table 1 described above, about the recording film, preferred contents by percentage of Mn and the group-X element(s) are varied in accordance with the composition of the recording film, the species of the dielectric film(s) (concerned), the oxidation state of the metals, and other factors, so as not to be easily decided without reservation. However, considering properties of Mn (for example, a property that Mn is smaller in sputtering rate than other elements), and others, it is preferred to control, for example, as described below. Similarly, a preferred content by percentage of O contained in the recording film is also varied in accordance with the composition of the recording film, the species of the dielectric film(s), the amounts of oxides of the metals, and other factors. Thus, it is preferred to control the content by percentage appropriately in order that the film can gain desired properties.

In the case of using, for the recording film, Mn—Bi—O, which contains Bi=the group-X element(s), the atomic proportion (%) of Mn into the total of Mn and Bi is preferably more than 20% and 60% or less, more preferably 30% or more and 50% or less. If the upper limit and the lower limit are out of these values, the recording film comes to be lowered in reflectivity.

In the recording film (Mn—Bi—O), a preferred proportion (atomic %) of O (oxygen) contained in the recording film is 1.1 times or more and 1.6 times or less that of the total of Mn and Bi. If the O proportion is less than 1.1 times, the proportion of oxides related to the decomposition is small so that the film cannot gain a good recording property. Reversely, if the proportion is more than 1.65 times, the film cannot gain a desired reflectivity.

In the case of using, for the recording film, Mn—In—O, which contains In=the group-X element(s), the atomic proportion (%) of Mn into the total of Mn and In is preferably more than 20% and 80% or less, more preferably 30% or more and 60% or less. If the upper limit and the lower limit are out of these values, the recording film comes to be lowered in reflectivity.

In the case of using, for the recording film, Mn—Cu—O, which contains Cu=the group-X element(s), the atomic proportion (%) of Mn into the total of Mn and Cu is preferably more than 10% and 80% or less, more preferably 20% or more and 60% or less. If the upper limit and the lower limit are out of these values, the recording film comes to be lowered in reflectivity.

In the case of using, for the recording film, Mn—Bi—Cu—O, which contains Bi and Cu=the group-X element(s), the atomic proportion (%) of Bi into the total of Mn, Bi and Cu is preferably 10% or more and 50% or less, more preferably 10% or more and 40% or less, even more preferably 20% or more and 40% or less. If the upper limit and the lower limit are out of these values, the recording film comes to be lowered in reflectivity. Furthermore, the atomic proportion (%) of Mn into the total of Mn, Bi and Cu is preferably 20% or more and 40% or less, more preferably 30% or more and 40% or less. If the upper limit and the lower limit are out of these values, the recording film comes to be lowered in reflectivity.

In the recording film (Mn—Bi—Cu—O), a preferred proportion (atomic %) of O (oxygen) contained in the recording film is 1.3 times or more that of the total of Mn, Bi and Cu. If the O proportion is less than 1.3 times, the proportion of oxides related to the decomposition is small so that the film cannot gain a good recording property.

In the case of using, for the recording film, Mn—Bi—In—O, which contains Bi and In=the group-X element(s), the atomic proportion (%) of Bi into the total of Mn, Bi and In is preferably 20% or more and less than 40%. If the upper limit and the lower limit are out of these values, the recording film comes to be lowered in reflectivity. Furthermore, the atomic proportion (%) of In into the total of Mn, Bi and In is preferably more than 20%, and 40% or less. If the upper limit and the lower limit are out of these values, the recording film comes to be lowered in reflectivity.

In the case of using, for the recording film, Mn—Ag—In—O, which contains Ag and In=the group-X element(s), the atomic proportion (%) of Mn into the total of Mn, Ag and In is preferably 30% or more and 50% or less, more preferably 30% or more and 40% or less. If the upper limit and the lower limit are out of these values, the recording film comes to be lowered in reflectivity. Furthermore, the atomic proportion (%) of In into the total of Mn, Ag and In is preferably 30% or more and 50% or less, more preferably 30% or more and less than 50%, and further more preferably 30% or more and 40% or less. If the upper limit and the lower limit are out of these values, the recording film comes to be lowered in reflectivity.

In a preferred embodiment of the invention, the group-X element(s) is/are Bi, Cu and Co, the atomic proportion (%) of Mn into the total of Mn, Bi, Cu and Co is 20% or more 40% or less, the atomic proportion (%) of Cu into the total of Mn, Bi, Cu and Co is 10% or more and 35% or less, and further the atomic proportion (%) of Bi into the total of Mn, Bi, Cu and Co is 10% or more and 30% or less.

The above has described the recording film of the invention for an optical information recording medium.

The invention includes an optical information recording medium having the recording film which the above has described. The structure of the optical information recording medium is not particularly limited, and may be an ordinarily used structure. In the invention, an example thereof is an optical information recording medium having the recording film, and one or more dielectric layers over and/or under this recording layer. Additionally, for example, an optical adjusting layer may be laid in the optical information recording medium.

The dielectric layer(s) is/are not particularly limited as far as the layer(s) is/are (each) a dielectric layer used ordinarily in an optical information recording medium. The layer may be made of, for example, an oxide such as $In_2O_3$, SnO, $SiO_2$, ZnS—$SiO_2$, ZnO, $TiO_2$ or $Al_2O_3$, or a nitride such as TiN, TaN, NbN, InN or AlN. Alternatively, the layer may be made of both of the oxide and the nitride. The dielectric layer has an effect of confining oxygen discharged by the decomposition of the oxide constituting the recording film, thereby making it possible to attain a change in the form of the film more effectively when a mark is formed therein. When record is made in the recording film, a high modulation degree can be given thereto. Furthermore, the dielectric layer can give a high endurance thereto in an accelerating test made ordinarily to evaluate the reliability of the optical information recording medium (the medium is kept in an environment of a temperature of 80° C. and a relative humidity of 85% for 96 hours). Furthermore, by adjusting the film thickness of the dielectric layer, the interference of light is controllable so that a reflectivity matching with a purpose can be given thereto.

The film thickness of the recording film (in the case of using the recording film alone in a mono-layered form without laying any dielectric layer, any optical adjusting layer, or any other layer) ranges preferably from 10 to 100 nm. If the film thickness of the recording film is too small, the film is increased in transmittance by irradiation thereof with a recording laser ray. Thus, the recording film cannot attain light absorption effectively. Additionally, the film is small in thickness at its sites changed by recording, so as to be reduced in modulation degree. Reversely, if the film thickness of the recording film is too large, the film comes to be lowered in productivity. The thickness ranges more preferably from 15 to 50 nm.

The film thickness (of each) of the dielectric layer(s) preferably ranges from approximately 2 to 30 nm. If the film thickness of the dielectric layer is too small, a change in the form of the recording layer is restrained to lower the modulation degree. The thickness ranges more preferably from 5 to 20 nm.

Preferably, the recording film of the invention is formed by a sputtering method. The sputtering method gives an optical information recording medium having an even composition. Specifically, reactive sputtering is performed, using a sputtering target containing the following: Mn; one or more elements (group-X element(s)) selected from the group consisting of Bi, Ag, Co, Cu, In, Sn and Zn (group X); and an inevitable impurity (inevitable impurity blended inevitably when the target is produced) as the balance. At this time, $O_2$ gas is introduced to around the target. In this way, a recording film containing a predetermined proportion of oxygen (O) can be deposited. The sputtering target may be an oxide sputtering target in which at least partial quantity of Mn or the group-X element(s) is oxidized. Alternatively, for example, the following sputtering targets are used and subjected to simultaneous discharge, whereby a desired recording film can be formed: a sputtering target made of the group-X element(s), or an oxide sputtering target wherein at least partial quantity of the group-X element(s) is oxidized; and a sputtering target made only of Mn, or an oxide sputtering target wherein at least partial quantity of Mn is oxidized.

A specific example of the composition of such a sputtering target is the same composition which the above-mentioned recording film has.

When the productivity and others are considered, it is preferred for forming the recording film by a high power that in any one of the above-mentioned metal sputtering targets or oxide sputtering targets, low-melting-point metals such as Bi, In, Sn and Zn are contained in the form of oxides. It is preferred that Ag, Cu and Co are contained in the form of respective metals. This case makes it possible to improve the sputtering target in density so that the endurance thereof can be heightened when the film is formed by the high power.

When the sputtering target is used to form the recording film by sputtering, preferred conditions for the sputtering are, for example, as follows: an Ar flow rate of 10 to 100 sccm; and an oxygen flow rate of 10 to 100 sccm. Other conditions for the sputtering may be widely-used sputtering conditions. The gas pressure and the sputtering electric power are controlled to range, for example, from 0.1 to 1.0 Pa, and from 0.5 to 20 W/cm$^2$, respectively.

The optical information recording medium of the invention is characterized by having the above-mentioned recording film, and preferably further has a dielectric layer. For its other member(s) other than the recording film, a structure known in the field of optical information recording media may be adopted.

The optical information recording medium (optical disc) may be a medium having a structure in which the recording film is laminated on a substrate having a groove made for the guide of a laser and further a light transmissible layer is laminated thereon.

Examples of the material of the substrate include polycarbonate resin, norbornene resin, cyclic olefin copolymer, and amorphous polyolefin. For the light transmissible layer, polycarbonate or an ultraviolet curable resin is usable. The material of the light transmissible layer is preferably a material high in transmittance to a laser for attaining record and reproduction, and small in light absorption. The thickness of the substrate is, for example, from 0.5 to 1.2 mm. The thickness of the light transmissible layer is, for example, from 0.1 to 1.2 mm.

The recording film of the invention is a film which shows a high reflectivity and shows an excellent recording property by itself. If necessary, an optical adjusting layer may be further laid between the substrate and the recording film in order to make the optical disc higher in reflectivity. Examples of the material of the optical adjusting layer include Ag, Au, Cu, Al, Ni, Cr and Ti, and alloys thereof.

The layer structure of the optical disc may be a mono-layered optical disc wherein the recording film is formed to have only one layer, as well as a light transmissible layer, or may be a multi-layered optical disc wherein plural recording films and plural light transmissible layers are formed.

When the optical disc has the recording films, the disc may have, for example, a transparent intermediate layer made of, for example, an ultraviolet curable resin between the following groups: a recording film group composed of one of the recording films and an optical adjusting layer and/or a dielectric layer that is/are optionally laminated; and another or the other different recording film group.

The characteristic of the optical information recording medium of the invention is in that the above-mentioned recording film (and, preferably, one or more dielectric layers) are adopted. No especial limitation is imposed onto a method for forming each of its substrate, light transmissible layer, optical adjusting layer, transparent intermediate layer and/or different layer(s), which are each any member other than this recording film and the dielectric layer(s). Thus, each of these members may be formed by an ordinarily-performed method to produce the optical information recording medium.

Examples of the form of the optical information recording medium include a CD, a DVD and a BD. A specific example thereof is a BD-R in which a blue laser ray having a wavelength of, for example, about 380 to 450 nm, preferably about 405 nm is radiated onto a recording film to succeed in the record and reproduction of data.

EXAMPLES

Hereinafter, the invention will be more specifically described by way of working examples. However, the examples do not limit the invention. Thus, the examples may each be carried out in the state that an appropriate modification is added thereto as far as the modified examples do not depart from the subject matter of the invention that has been described hereinbefore or will be described hereinafter. All of the modified examples are included in the scope of the invention.

(1) Formations of Optical Discs

As a substrate for an optical disc, a polycarbonate substrate (thickness: 1.1 mm, diameter: 12 cm, track pitch: 0.32 µm, and groove depth: 25 nm) was used. By DC magnetron sputtering, recording films having various compositions shown in Table 3, respectively, were each formed on the substrate. The film thickness of each of the recording films was set to 40 nm. When the recording film contained Bi, a Bi oxide target was used; when the film contained Cu, a Cu oxide target was used; when the film contained Co, a Co metal target was used; when the film contained Mn, a Mn metal target was used; when the film contained In, an In metal target was used; and when the film contained Ag, a Ag metal target was used. The film was formed by multi-component sputtering based on simultaneous discharge.

Conditions for the sputtering for forming the recording film were as follows: an Ar flow rate of 10 sccm; an oxygen flow rate of 20 sccm; a gas pressure of 0.4 Pa; a DC sputtering power of 100 to 200 W; and a substrate temperature of room temperature. According to the film-forming conditions of present examples, at least partial quantity of each of the added metal elements was oxidized in all of the examples in Table 3.

The composition of components in each of the formed recording films was obtained by measurement according to ICP emission spectrometry.

Next, as protecting films (dielectric layers), $In_2O_3$ films were formed, respectively, on and underneath each of the recording films by DC magnetron sputtering, so as to have a thickness of 10 nm. A target used therein was an $In_2O_3$ target. Conditions for the sputtering for forming the dielectric layers were set as follows: an Ar flow rate of 10 sccm, an oxygen flow rate of 15 sccm, a gas pressure of 0.4 Pa, a DC sputtering power of 100 to 200 W, and a substrate temperature of room temperature.

Next, an ultraviolet curable resin ("BRD-864", manufactured by Nippon Kayaku Co., Ltd.) was painted, for a light transmissible layer, onto the dielectric layer formed on the recording film by spin coating. Thereafter, ultraviolet rays were radiated onto the workpiece to form the light transmissible layer having the film thickness of about 0.1 mm. In this way, each optical disc was yielded.

(2) Optical Disc Evaluation

About each of the optical discs produced as described above, the recording power, the jitter value and the modulation degree thereof were measured as follows:

An optical disc evaluating device used in the present examples was a device "ODU-1000" manufactured by Pulstec Industrial Co., Ltd. The central wavelength of the recording laser was set to 405 nm. A lens having an NA (numerical aperture) of 0.85 was used. For reflectivities described below, this device was used to radiate a laser onto the track. The reflectivities were each obtained from the intensity of a returned light ray of the laser light from a non-recorded region in the optical disc.

The light disc evaluating device was used to measure the modulation degree and the jitter value at recording powers of 2 to 20 mW, using multi-signals which were from 2T to 8T signals, under conditions that the linear velocity was 4.92 m/s and a standard clock frequency was 66 MHz. The modulation degree, out of the two, is a value obtained by dividing a difference between the maximum reflectivity and the minimum reflectivity of the recorded region by the maximum reflectivity. The jitter value is a value showing a standard deviation of error values from standard clocks of the 2T to 8T signals.

At a recording power at which the jitter value of the disc turned to the minimum value (in the present examples, this power is defined as the recording power thereof), the modulation degree (rate of a change in the reflectivity) was calculated from an equation (1) described below. Out of the discs, the following was judged to be acceptable in the present examples: any disc about which the recording power was 9.0 mW or less, the minimum value of the jitter value was 6.5% or less, and the modulation degree was 0.40 or more.

Modulation degree (rate of a change in the reflectivity) =["reflectivity of the non-recorded region"–"reflectivity of the recorded region"]/"reflectivity of the non-recorded region" (1)

Furthermore, the device "ODU-1000" manufactured by Pulstec Industrial Co., Ltd. was used to calculate the reflectivity of each of the optical discs (the reflectivity of each of the samples in the disc state) produced as described above on the basis of SUM2 level measured results of a commercially available BD-RE disc on the supposition that 320 mV at the SUM2 level corresponded to a reflectivity of 16%. In the present examples, any disc having a reflectivity of 9% or more, out of the discs, was judged to be acceptable.

These results are together shown in Table 3. The words "unmeasurable" in Table 3 each denote, out of the samples, a sample which failed in undergoing tracking according to the evaluating device, so as to be unable to be measured.

TABLE 3

| No. | | Recording power (mW) | Jitter value (%) | Modulation degree | Reflectivity (%) | Evaluation |
|---|---|---|---|---|---|---|
| 1 | In90Mn10 | 17.0 | Unmeasurable | 0.55 | 8.5 | X |
| 2 | In80Mn20 | 9.3 | 6.72 | 0.47 | 9.1 | X |
| 3 | In60Mn40 | 7.3 | 5.16 | 0.73 | 9.8 | ○ |
| 4 | In40Mn60 | 5.9 | 4.96 | 0.75 | 10.3 | ○ |
| 5 | In20Mn80 | 5.2 | 4.65 | 0.76 | 10.1 | ○ |
| 6 | Cu90Mn10 | 8.0 | Unmeasurable | 0.67 | 10.2 | X |
| 7 | Cu70Mn30 | 5.9 | 5.42 | 0.74 | 10.0 | ○ |
| 8 | Cu60Mn40 | 5.3 | 5.28 | 0.72 | 12.0 | ○ |
| 9 | Cu20Mn80 | 5.4 | 5.27 | 0.73 | 12.1 | ○ |
| 10 | Cu30Co30Mn40 | 7.5 | 6.90 | 0.57 | 11.4 | X |
| 11 | Bi | 4.6 | 5.98 | 0.77 | 3.9 | X |
| 12 | Bi95Mn5 | 4.4 | 6.05 | 0.71 | 5.4 | X |
| 13 | Bi90Mn10 | 4.2 | 5.95 | 0.73 | 7.0 | X |
| 14 | Bi80Mn20 | 4.2 | 5.90 | 0.74 | 8.5 | X |
| 15 | Bi60Mn40 | 4.3 | 5.96 | 0.81 | 10.4 | ○ |
| 16 | Bi40Mn60 | 4.4 | 5.55 | 0.74 | 11.6 | ○ |
| 17 | Cu30Bi50Mn20 | 4.1 | 5.52 | 0.70 | 9.4 | ○ |
| 18 | Cu40Bi30Mn30 | 4.2 | 5.77 | 0.59 | 10.2 | ○ |
| 19 | Cu50Bi20Mn30 | 4.9 | 5.84 | 0.65 | 11.0 | ○ |
| 20 | Cu50Bi30Mn20 | 4.7 | 5.83 | 0.71 | 9.8 | ○ |
| 21 | Cu55Bi25Mn20 | 4.1 | 4.94 | 0.57 | 10.0 | ○ |
| 22 | Cu60Bi10Mn30 | 5.1 | 6.41 | 0.63 | 10.8 | ○ |
| 23 | Cu60Bi30Mn10 | 4.3 | 5.52 | 0.64 | 8.5 | X |
| 24 | In10Bi50Mn40 | 4.5 | 4.83 | 0.70 | 8.1 | X |
| 25 | In20Bi40Mn40 | 4.2 | 4.66 | 0.66 | 8.3 | X |
| 26 | In30Bi30Mn40 | 5.5 | 4.91 | 0.73 | 10.8 | ○ |
| 27 | In40Bi20Mn40 | 5.7 | 4.56 | 0.76 | 9.8 | ○ |
| 28 | Cu35Co15Bi30Mn20 | 4.1 | 4.77 | 0.57 | 9.7 | ○ |
| 29 | Cu25Co25Bi30Mn20 | 4.2 | 4.78 | 0.56 | 10.3 | ○ |
| 30 | Cu25Co25Bi25Mn25 | 4.6 | 5.16 | 0.61 | 10.9 | ○ |
| 31 | Cu25Co25Bi20Mn30 | 4.6 | 5.07 | 0.61 | 10.5 | ○ |
| 32 | Cu25Co25Bi10Mn40 | 5.1 | 4.85 | 0.77 | 10.3 | ○ |
| 33 | Cu10Co40Bi30Mn20 | 4.1 | 4.89 | 0.54 | 10.0 | ○ |
| 34 | Ag | Unmeasurable | Unmeasurable | 0.61 | 8.6 | X |
| 35 | In80Ag20 | 7.6 | 5.45 | 0.70 | 7.0 | X |
| 36 | In50Ag20Mn30 | 6.4 | 5.72 | 0.62 | 9.1 | ○ |
| 37 | In40Ag20Mn40 | 6.5 | 5.93 | 0.80 | 10.0 | ○ |
| 38 | In30Ag20Mn50 | 5.8 | 5.95 | 0.74 | 10.7 | ○ |

From Table 3, it is understood that the samples in each of which the recording film contained Mn, the group-X element(s) and O, and the respective proportions of Mn and the group-X element(s) to all the metal elements satisfied the ranges preferred in the invention (Nos. 3-5, 7-9, 15-22, 26-33 and 36-38 in Table 3) were each high in modulation degree, excellent in recording sensitivity at the practical recording laser power, and good in reflectivity property.

By contrast, sample No. 11, which was made of pure Bi, was lowered in not only recording power not also reflectivity. About sample No. 34, which was made of pure Ag, the disc failed in undergoing tracking according to the device, so that the recording power and the jitter value were unmeasurable. The modulation degree was also heightened and the reflectivity was also lowered.

The samples in each of which the recording film contained Mn, the group-X element(s) and O but the respective proportions of Mn and the group-X element(s) to all the metal elements did not satisfy the ranges preferred in the invention (Nos. 1, 2, 6, 10, 12-14, and 23-25) were each lowered in any one of the above-mentioned properties, for example, in reflectivity.

Sample No. 35, which did not contain Mn, was made lower in reflectivity than samples Nos. 37 and 38.

The present application has been described in detail or with reference to the specified embodiments. However, it is evident for those skilled in the art that various changes or modifications can be added thereto without departing from the spirit and scope of the invention.

The present application is based on Japanese Patent Application (No. 2011-122910) filed on May 31, 2011, and the contents thereof are incorporated hereinto by reference.

Industrial Applicability

The invention makes it possible to provide a recording film for an optical information recording medium (particularly, a recording film for a recordable-type optical information recording medium) that can attain a high modulation degree and a low jitter value even at a practical recording laser power, which is relatively low, and that further gives a sufficiently high reflectivity when made into an optical information recording medium; and an optical information recording medium (particularly, a recordable-type optical information recording medium) having this recording film.

The invention also makes it possible to provide a sputtering target useful for forming the recording film.

The invention claimed is:

1. A recording film, comprising:
   Mn;
   one or more X elements; and
   oxygen;
   wherein
   the one or more X elements satisfy one of conditions (A) to (E):
   (A) the one or more X elements are Cu, and, based on a total amount of Mn and Cu, an atomic proportion of Mn is more than 10% and 80% or less,
   (B) the one or more X elements are Bi and Cu, and, based on a total amount of Mn, Bi and Cu, an atomic proportion of Bi is 10% or more and 50% or less, and an atomic proportion of Mn is 20% or more and 40% or less,
   (C) the one or more X elements are Bi and In, and, based on a total amount of Mn, Bi and In, an atomic proportion of Bi is 20% or more and less than 40%, and an atomic proportion of In is more than 20% and 40% or less,
   (D) the one or more X elements are Ag and In, and, based on a total amount of Mn, Ag and In, an atomic proportion of Mn is 30% or more and 50% or less, and an atomic proportion of In is 30% or more and 50% or less, and
   (E) the one or more X elements are Bi, Cu and Co, and, based on a total amount of Mn, Bi, Cu and Co, an atomic proportion of Mn is 20% or more and 40% or less, an atomic proportion of Cu is 10% or more and 35% or less, and an atomic proportion of Bi is 10% or more and 30% or less;
   the recording film is suitable for an optical information recording medium recordable by irradiation with a laser ray; and
   at least part of Mn and part of the one or more X elements are oxidized.

2. An optical information recording medium, comprising the recording film of claim 1.

3. An optical information recording medium, comprising:
   the recording film of claim 1, and
   one or more dielectric layers,
   wherein the one or more dielectric layers are present over, under, or both over and under the recording film.

4. The optical information recording medium of claim 3, wherein the recording film has a film thickness of from 10 to 100 nm, and the one or more dielectric layers have a thickness of from 2 to 30 nm.

5. A sputtering target for forming the recording film of claim 1, comprising:
   Mn; and
   one or more X elements,
   wherein the one or more X elements satisfy one of conditions (A) to (E):
   (A) the one or more X elements are Cu, and, based on a total amount of Mn and Cu, an atomic proportion of Mn is more than 10% and 80% or less,
   (B) the one or more X elements are Bi and Cu, and, based on a total amount of Mn, Bi and Cu, an atomic proportion of Bi is 10% or more and 50% or less, and an atomic proportion of Mn is 20% or more and 40% or less,
   (C) the one or more X elements are Bi and In, and, based on a total amount of Mn, Bi and In, an atomic proportion of Bi is 20% or more and less than 40%, and an atomic proportion of In is more than 20% and 40% or less,
   (D) the one or more X elements are Ag and In, and, based on a total amount of Mn, Ag and In, an atomic proportion of Mn is 30% or more and 50% or less, and an atomic proportion of In is 30% or more and 50% or less, and
   (E) the one or more X elements are Bi, Cu and Co, and, based on a total amount of Mn, Bi, Cu and Co, an atomic proportion of Mn is 20% or more and 40% or less, an atomic proportion of Cu is 10% or more and 35% or less, and an atomic proportion of Bi is 10% or more and 30% or less.

* * * * *